Jan. 14, 1958 W. HERMES 2,820,144
STABILIZED FEEDBACK OSCILLATOR
Filed Nov. 18, 1954
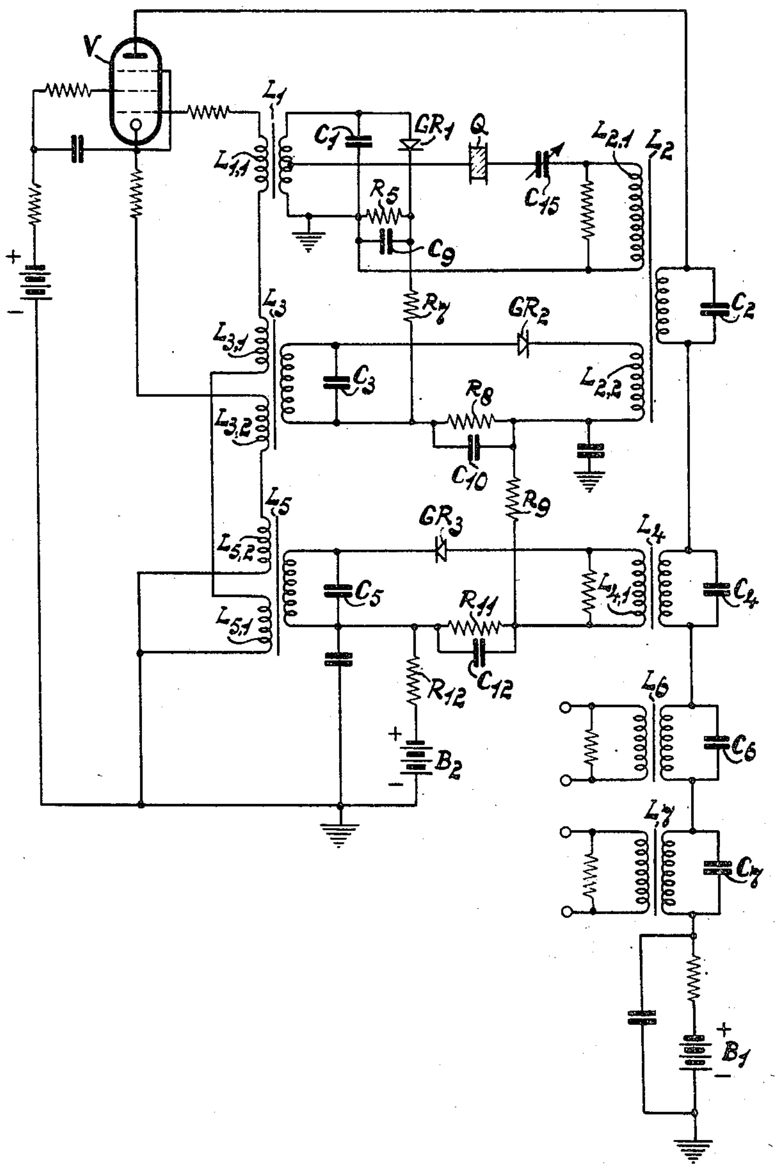
INVENTOR
WILLEM HERMES
BY Fred M. Vogel
AGENT United States Patent Office 2,820,144

Patented Jan. 14, 1958

2,820,144

STABILIZED FEEDBACK OSCILLATOR

Willem Hermes, Hilversum, Netherlands, assignor, by mesne assignments, to North American Philips Company, Inc., New York, N. Y., a corporation of Delaware Application November 18, 1954, Serial No. 469,742

Claims priority, application Netherlands December 14, 1953

5 Claims. (Cl. 250—36)

This invention relates to oscillators comprising a feedback circuit including a very selective element, for example a crystal or a cavity resonator, for producing local oscillations of a frequency determined by the selective element. The oscillation produced by such oscillators usually satisfy severe requirements in regard to their frequency stability.

However, crystals and cavity resonators for such oscillators are in practice serviceable only at comparatively high frequencies, so that it is common practice in stabilising frequencies lower than those at which the said selective elements can be used, to produce the said frequencies by means of separate oscillators synchronized with the aid of higher harmonics which can be produced by an oscillator comprising one of the said selective elements. However, each oscillator requires inter alia an amplifying element and the required equipment thus becomes fairly expensive, more particularly if the frequencies desired are considerably lower than those which can be produced with the use of the very selective elements, and if the division of frequency takes place in a stepwise manner.

The device according to the invention mitigates the said disadvantage and exhibits the characteristic that the oscillator comprises, in addition to the first feedback circuit containing a frequency-selective element, at least one further feedback circuit selective for the subharmonic of the oscillator frequency and intended for producing oscillations of a frequency equal to the said subharmonic, the local oscillation being also supplied to the further feedback circuit for synchronizing the said subharmonic, whereby said frequency-selective element becomes a master frequency-selective element for stabilizing all of the frequencies produced by the oscillator.

In order that the invention may be readily carried into effect, it will now be described with reference to the accompanying drawing, given by way of example, which shows a circuit for producing oscillations of the frequencies 108 kc./s., 36 kc./s. and 12 kc./s., in which the oscillation of the frequency 108 kc./s. is stabilized with the aid of a crystal Q. The said frequencies are chosen arbitrarily, but on the understanding that the highest frequency can be stabilized by a very selective element, whereas this is difficult for the lower frequencies. Furthermore, the lower frequencies are subharmonics of the highest frequency.

In the figure, V indicates the amplifying element, i. e. an amplifying tube. The anode circuit of this tube is connected to a battery $B_1$ and includes inter alia an anode transformer $L_2$—$C_2$ which is tuned to 108 kc./s. and which forms part of the feedback circuit for the said frequency via a secondary winding $L_{2,1}$. The said circuit furthermore comprises the crystal Q, the tuning of which may be controlled by a capacity $C_{15}$, and a grid transformer $L_1$—$C_1$ which is tuned to 108 kc./s. and of which the secondary winding $L_{1,1}$ is included in the grid circuit. The operation of the oscillator thus obtained, which may be assumed to be known, will not be discussed in this specification. In the circuit shown the amplitude of the oscillation produced by the oscillator is limited by a unilaterally conductive element $GR_1$. The current flowing through the circuit of a battery $B_2$ via resistors $R_{12}$, $R_{11}$, $R_9$, $R_8$, $R_7$ and $R_5$ to earth provides via an RC-combination $R_5$—$C_9$ a biassing potential for $GR_1$. This biassing potential is not required, but in the presence thereof the voltage produced is usually materially higher.

A further feedback circuit is constituted by a grid transformer $L_3$—$C_3$ which is tuned to a subharmonic of the frequency determined by the crystal, i. e. 36 kc./s., the grid circuit which includes one secondary winding $L_{3,1}$ of the grid transformer $L_3$—$C_3$ and the cathode circuit which includes a second secondary winding $L_{3,2}$ of the said grid transformer. The oscillation produced by this feedback circuit is limited by a unilaterally conductive element $GR_2$, the biasing potential of which being provided via an RC-combination $R_8$—$C_{10}$ by the current from battery $B_2$ in the circuit $R_{12}$, $R_{11}$, $R_9$, $R_8$, $R_7$ and $R_5$.

In order that the frequency stability of the oscillations produced by the said feedback circuit may be chosen equal to the frequency stability of the oscillation produced by the first feedback circuit, which includes the crystal, the oscillation of frequency 36 kc./s., which thus is a subharmonic of the oscillation of frequency 108 kc./s., is synchronized with the oscillation of frequency 108 kc./s. by applying the latter oscillation in series with the limiting circuit in the second feedback circuit. In the embodiment shown, this is effected by connecting a secondary winding $L_{2,2}$ of the anode transformer tuned to 108 kc./s. in series with the limiting circuit. If desired, a secondary winding may alternatively be used for this purpose on the grid transformer $L_1$—$C_1$. The oscillation of frequency 36 kc./s. may be derived via an impedance included in the anode circuit, for example, via a transformer $L_6$—$C_6$ which is tuned to 36 kc./s.

The figure also shows a third feedback circuit for 12 kc./s., which is similar to that for 36 kc./s. This circuit is constituted by a grid transformer $L_5$—$C_5$ which is tuned to 12 kc./s., the grid circuit which includes one secondary winding $L_{5,1}$ of the grid transformer $L_5$—$C_5$, and the cathode circuit which includes a second secondary winding $L_{5,2}$. The limitation is effected in a similar manner as for the second feedback circuit, viz. with the use of the unilaterally conductive element $GR_3$, which acquires its biassing potential via an RC-combination $R_{11}$—$C_{12}$. The synchronization may likewise be effected with the aid of the oscillation of frequency 108 kc./s., but it is preferable to bring about the synchronisation with the aid of the oscillation of frequency 36 kc./s., since the ratio between the frequency produced and the synchronizing frequency is in this case considerably smaller. For this purpose in the figure a secondary winding $L_{4,1}$ of the anode transformer $L_4$—$C_4$, tuned to 36 kc./s., is connected in series with the limiting circuit. Thet oscillation of frequency 12 kc./s. may likewise be derived via an impedance included in the anode circuit, for example via a transformer $L_7$—$C_7$ which is tuned to 12 kc./s.

What is claimed is:

1. An oscillator comprising a feedback circuit including a master frequency-selective element and arranged to produce local oscillations at a frequency determined by said master frequency-selective element, a second feedback circuit including a tuned circuit which is tuned to a subharmonic of said local oscillations and arranged to produce subharmonic oscillations at a frequency determined by said tuned circuit, and means connected to apply said local oscillations to said second feedback circuit thereby to synchronize said subharmonic oscillations at a subharmonic frequency of said master frequency-selective element.

2. An oscillator as claimed in claim 1, including a third feedback circuit including a tuned circuit which is tuned to another subharmonic of said local oscillations which is lower in frequency than the first-named subharmonic and arranged to produce other subharmonic oscillations at a frequency determined by said last-named tuned circuit, and means connected to apply said first-named subharmonic oscillations to said third feedback circuit thereby to synchronize said other subharmonic oscillations at a subharmonic frequency of said master frequency-selective element.

3. An oscillator as claimed in claim 1, in which each of said feedback circuits includes a unilaterally conductive element connected to limit the amplitudes of said oscillations, respectively.

4. An oscillator as claimed in claim 3, including biasing means connected to bias said unilaterally conductive elements thereby to limit the amplitudes of said oscillations to predetermined values.

5. An oscillator as claimed in claim 3, including an impedance connected in series with the unilaterally conductive element in said second feedback circuit, and means connected to apply said local oscillations across said impedance.

References Cited in the file of this patent

UNITED STATES PATENTS

| | | |
|---|---|---|
| 2,159,595 | Miller | May 23, 1939 |
| 2,159,596 | Miller | May 23, 1939 |

FOREIGN PATENTS

| | | |
|---|---|---|
| 896,865 | France | Mar. 6, 1945 |